United States Patent
Mori et al.

(10) Patent No.: US 10,432,188 B2
(45) Date of Patent: Oct. 1, 2019

(54) RINGING SUPPRESSION CIRCUIT AND RINGING SUPPRESSION METHOD

(71) Applicants: DENSO CORPORATION, Kariya, Aichi-pref. (JP); SOKEN, INC., Nisshin, Aichi-pref. (JP)

(72) Inventors: Hiroyuki Mori, Nisshin (JP); Takuya Honda, Kariya (JP); Tomohisa Kishigami, Kariya (JP); Hirofumi Isomura, Kariya (JP)

(73) Assignees: DENSO CORPORATION, Kariya (JP); SOKEN, INC., Nisshin (JP)

( * ) Notice: Subject to any disclaimer, the term of this patent is extended or adjusted under 35 U.S.C. 154(b) by 0 days.

(21) Appl. No.: 16/099,711

(22) PCT Filed: Aug. 4, 2017

(86) PCT No.: PCT/JP2017/028449
§ 371 (c)(1),
(2) Date: Nov. 8, 2018

(87) PCT Pub. No.: WO2018/037883
PCT Pub. Date: Mar. 1, 2018

(65) Prior Publication Data
US 2019/0190516 A1 Jun. 20, 2019

(30) Foreign Application Priority Data
Aug. 23, 2016 (JP) .................... 2016-162794
Jul. 24, 2017 (JP) .................... 2017-142955

(51) Int. Cl.
*H03K 17/16* (2006.01)
*H04L 25/02* (2006.01)

(52) U.S. Cl.
CPC .......... *H03K 17/16* (2013.01); *H04L 25/026* (2013.01); *H04L 25/028* (2013.01)

(58) Field of Classification Search
None
See application file for complete search history.

(56) References Cited

U.S. PATENT DOCUMENTS 5,949,825 A * 9/1999 Naffziger ............... H04L 25/02
326/30
8,593,202 B2   11/2013 Mori et al.
(Continued)

FOREIGN PATENT DOCUMENTS

JP      2006-060505 A      3/2006

*Primary Examiner* — Cassandra F Cox
(74) *Attorney, Agent, or Firm* — Posz Law Group, PLC

(57) ABSTRACT

A ringing suppression circuit connected to a transmission line to suppress ringing caused by the transmission line transmitting a differential signal using a pair of signal lines, the differential signal varying between a high level and a low level, the pair of signal lines including a high potential signal line and a low potential signal line, the ringing suppression circuit including: an inter-line switching element that is connected between the pair of signal lines; a control portion that performs a ringing suppression operation in response to detecting a level change in the differential signal, wherein the ringing suppression operation turns on the inter-line switching element to decrease an impedance between the pair of signal lines; and a suppression operation prohibiting portion that prohibits the control portion from performing the ringing suppression operation in response to detecting a signal caused by a signal on the transmission line.

11 Claims, 11 Drawing Sheets

(56) References Cited

U.S. PATENT DOCUMENTS

| | | | |
|---|---|---|---|
| 10,128,825 B2* | 11/2018 | Mori | H03K 5/08 |
| 10,164,620 B1* | 12/2018 | Honda | H03K 19/00361 |
| 2019/0097681 A1* | 3/2019 | Honda | H04B 3/42 |
| 2019/0158143 A1* | 5/2019 | Honda | H03K 5/1252 |
| 2019/0158144 A1* | 5/2019 | Honda | H03K 5/1252 |

* cited by examiner

RINGING SUPPRESSION CIRCUIT AND RINGING SUPPRESSION METHOD

CROSS REFERENCE TO RELATED APPLICATIONS

This application is the U.S. national phase of International Application No. PCT/JP2017/028449 filed Aug. 4, 2017 and is based on Japanese Patent Application No. 2016-162794 filed on Aug. 23, 2016 and Japanese Patent Application No. 2017-142955 filed on Jul. 24, 2017, the disclosures of which are incorporated herein by reference.

TECHNICAL FIELD

The present disclosure relates to a circuit connected to a transmission line to suppress ringing caused by the transmission line transmitting a differential signal using a pair of high potential signal line and a low potential signal line. The present disclosure further relates to a method for suppressing the ringing.

BACKGROUND ART

When transmitting a digital signal via a transmission line, a part of signal energy may be reflected at a timing when a signal level changes in a receiving side, and waveform distortion such as overshoot or undershoot, that is, ringing may occur in the signal. Various techniques for suppressing waveform distortion have been proposed. For example, Patent Literature 1 discloses a technique for suppressing ringing by matching impedances only for a certain period in which communication is not affected by transition of voltage level between a low level and a high level in the transmission line.

PRIOR ART LITERATURE

Patent Literature

Patent Literature 1: JP 5498527 B2

SUMMARY OF INVENTION

However, in Patent Literature 1, as shown in FIGS. 16 to 19, suppose that an edge is generated in a signal due to a superimposed noise in a period in which a high level of a differential signal, for example, a dominant in a CAN (Controller Area Network, registered trademark) communication protocol is transmitted. In this case, the edge in the signal may be detected as a change to the low level, and a ringing suppression operation may be performed. As a result, if the ringing suppression operation is performed at one or more nodes connected to network, an impedance of the network may decrease and dominant differential voltage may decrease. A period in which a received signal RxD is erroneously determined as low level, for example, recessive, becomes longer than a conventional communication transceiver not equipped with the ringing suppression technique, and the bit is more likely to be erroneously determined as recessive. A signal RSC_ON shown in FIG. 18 is an ON signal of a switching element for performing the ringing suppression operation to decrease the impedance of the transmission line. A broken line in FIG. 19 is a waveform of the received signal RxD in the absence of ringing suppression function.

It is an object of the present disclosure to provide a ringing suppression circuit and a ringing suppression method capable of avoiding improper operation caused by a superimposed noise.

According to an aspect of the present disclosure, a suppression operation prohibiting portion prohibits a control portion from performing a ringing suppression operation in response to detecting a signal caused by a signal on a transmission line. A noise superimposed on the transmission line transmitting a differential signal is caused by the signal on the transmission line. The suppression operation prohibiting portion detects the signal caused by the signal on the transmission line and prohibits the ringing suppression operation, and thereby to avoid improper operation caused by the superimposed noise.

According to an aspect of the present disclosure, a signal outputting portion of the suppression operation prohibiting portion outputs a suppression operation prohibiting signal to the control portion when an upper limit determining portion determines that a level of an in-phase signal is greater than an upper threshold or a lower limit determining portion determines that the level of the in-phase signal is less than the lower threshold. After outputting the suppression operation prohibiting signal, the signal outputting portion suspends outputting the suppression operation prohibiting signal when a normal range determining portion determines that the level of the in-phase signal is within a certain range. A noise superimposed on a transmission line transmitting a differential signal appears as an in-phase signal. The suppression operation prohibiting portion outputs the suppression operation prohibiting signal to the control portion during a period in which the in-phase signal greater than a certain level is generated in the transmission line, and thereby to prohibit the ringing suppression operation.

According to an aspect of the present disclosure, a signal outputting portion of the suppression operation prohibiting portion outputs a suppression operation prohibiting signal to the control portion during a period in which absolute values of a level change in the high potential signal line and the level change in the low potential signal line, which are determined by a high potential polarity determining portion and a low potential polarity determining portion, are greater than a predetermined value, and a polarity of the level change in the high potential signal line and a polarity of the level change in the low potential signal line consist with each other. When an in-phase signal is generated in a transmission line, the polarity of the level change in the high potential signal line and the polarity of the level change in the low potential signal line consist with each other. By outputting the suppression operation prohibiting signal to the control portion during a period in which the polarities of the level changes consist with each other, the ringing suppression operation is prohibited.

According to an aspect of the present disclosure, a signal outputting portion of the suppression operation prohibiting portion outputs a suppression operation prohibiting signal to the control portion during a period in which a voltage level of the high potential signal line is less than a threshold or a voltage level of the low potential signal line is greater than a threshold. Depending on a condition of a circuit board, a large level noise may be induced to either the high level side or the low level side. By determining that the noise is superimposed when the voltage level of the high potential signal line is less than the threshold or the voltage level of the low potential signal line is greater than the threshold, improper operation is avoided.

BRIEF DESCRIPTION OF DRAWINGS

The above and other objects, features and advantages of the present disclosure will become more apparent from the following detailed description made with reference to the accompanying drawings, in which.

DESCRIPTION OF EMBODIMENTS (First Embodiment)

Figure 1:
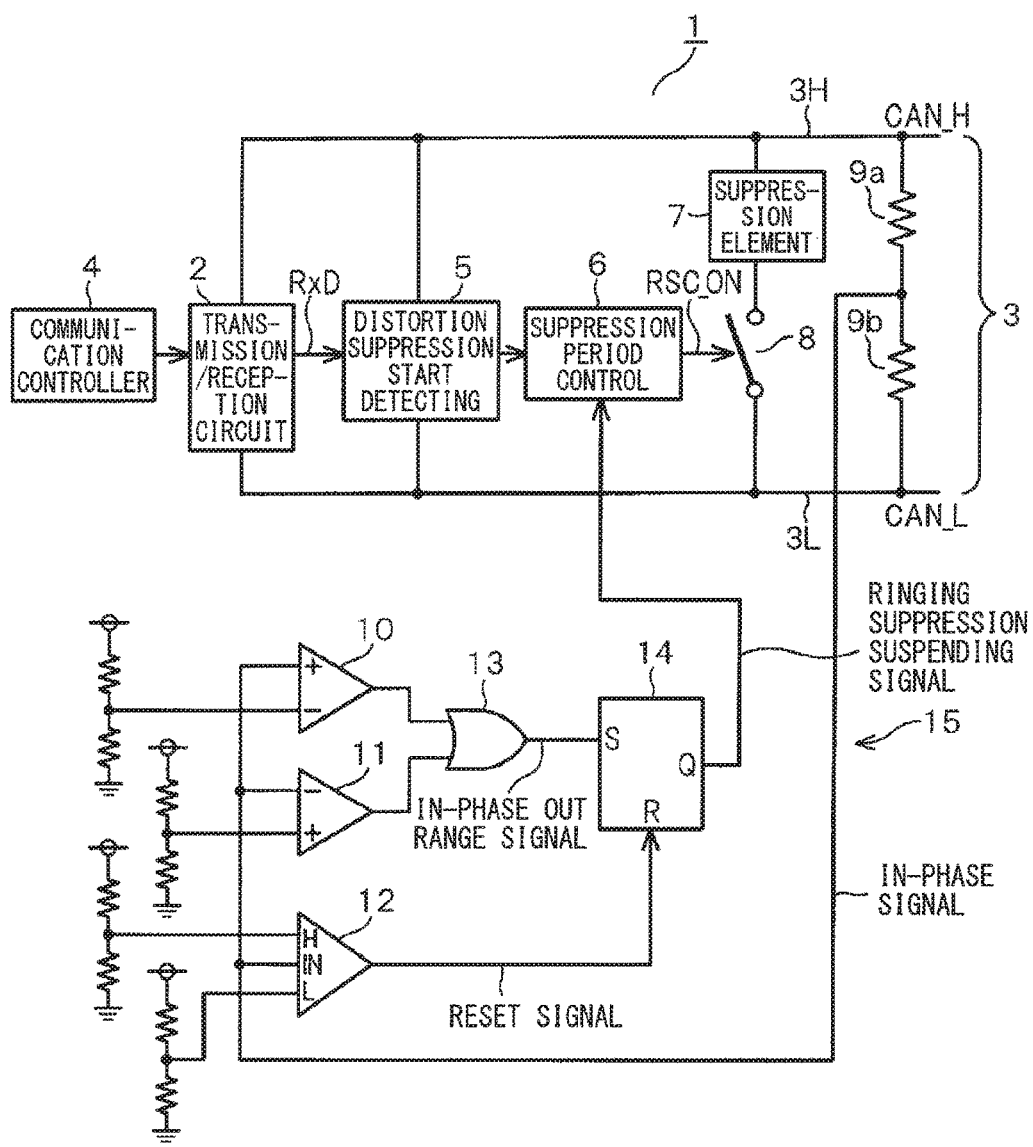
FIG. 1 is a functional block diagram showing a configuration of a ringing suppression circuit according to a first embodiment.

Hereinafter, a first embodiment will be described. As shown in FIG. 1, a ringing suppression circuit 1 is connected in parallel to a transmission line 3 together with a transmission and reception circuit 2. The transmission line 3 includes a high potential signal line 3H and a low potential signal line 3L. The transmission and reception circuit 2 may be replaced by a transmission circuit or a reception circuit. The transmission and reception circuit 2 is controlled by a communication controller 4 to drive the transmission line 3 to transmit a differential signal. When the transmission and reception circuit 2 receives a differential signal transmitted from another transmission node via the transmission line 3, the transmission and reception circuit 2 inputs received data to the communication controller 4. When a communication protocol is CAN, the high potential signal line 3H corresponds to CAN_H and the low potential signal line 3L corresponds to CAN_L.

The distortion suppression start detecting portion 5 detects that a voltage of the transmission line 3 has changed when a differential signal is transmitted. Then, the distortion suppression start detecting portion 5 supplies a trigger signal to the suppression period control portion 6 to start a suppression operation for a distortion, that is, ringing. Between the signal lines 3H and 3L, a series circuit including a suppression element 7 and a switch circuit 8 is connected. When the suppression period control portion 6 receives the above trigger signal, the suppression period control portion 6 turns on the switch circuit 8 only for a set suppression period to decrease an impedance of the transmission line 3.

Between the signal lines 3H and 3L, a series circuit including resistor elements 9a and 9b is connected. A common connection point of the resistor elements 9a and 9b is connected to an inverting input terminal, a non-inverting input terminal and an input terminal IN of each of three comparators 10 to 12. The comparator 10 compares a level of an in-phase signal detected as a potential of the common connection point with an upper limit threshold. The comparator 11 compares the level of the in-phase signal with a lower limit threshold.

The transmission line 3 transmits a differential signal using the high potential signal line 3H and the low potential signal line 3L. The differential signal varies between a high level and a low level. An in-phase signal is obtained as a signal generated due to the values of the high potential signal line 3H and the low potential signal line 3L. Specifically, in the present embodiment, a signal value that is substantially intermediate between the high potential signal line 3H and the low potential signal line 3L varying according to the high level and the low level is set as an in-phase signal. As shown in FIG. 1, the in-phase signal is taken out from the middle point between the high potential signal line 3H and the low potential signal line 3L.

The comparator 12 is a window comparator, and sets an output signal to a high level when the level of the in-phase signal is within a certain range ($L \leq IN \leq H$). For example, in CAN communication, the upper limit threshold and the lower limit threshold are set to about ±12 V, and the certain range of the comparator 12 is set to about −12 V to 12 V. The comparators 10 to 12 correspond to an upper limit determining portion, a lower limit determining portion, and a normal range determining portion, respectively.

The output terminals of the comparators 10 and 11 are connected to input terminals of an OR gate 13. An output terminal of the OR gate 13 is connected to a set terminal S of an RS flip-flop 14. The output terminal of the comparator 12 is connected to a reset terminal R of the RS flip-flop 14. The reset terminal R is a positive edge trigger. An output terminal Q of the RS flip-flop 14 is connected to the input terminal of the suppression period control portion 6. The OR gate 13 and the RS flip-flop 14 correspond to a signal outputting portion. In the above configuration, the comparators 10 to 12, the OR gate 13 and the RS flip-flop 14 correspond to a suppression operation prohibiting portion 15.

Figure 2:
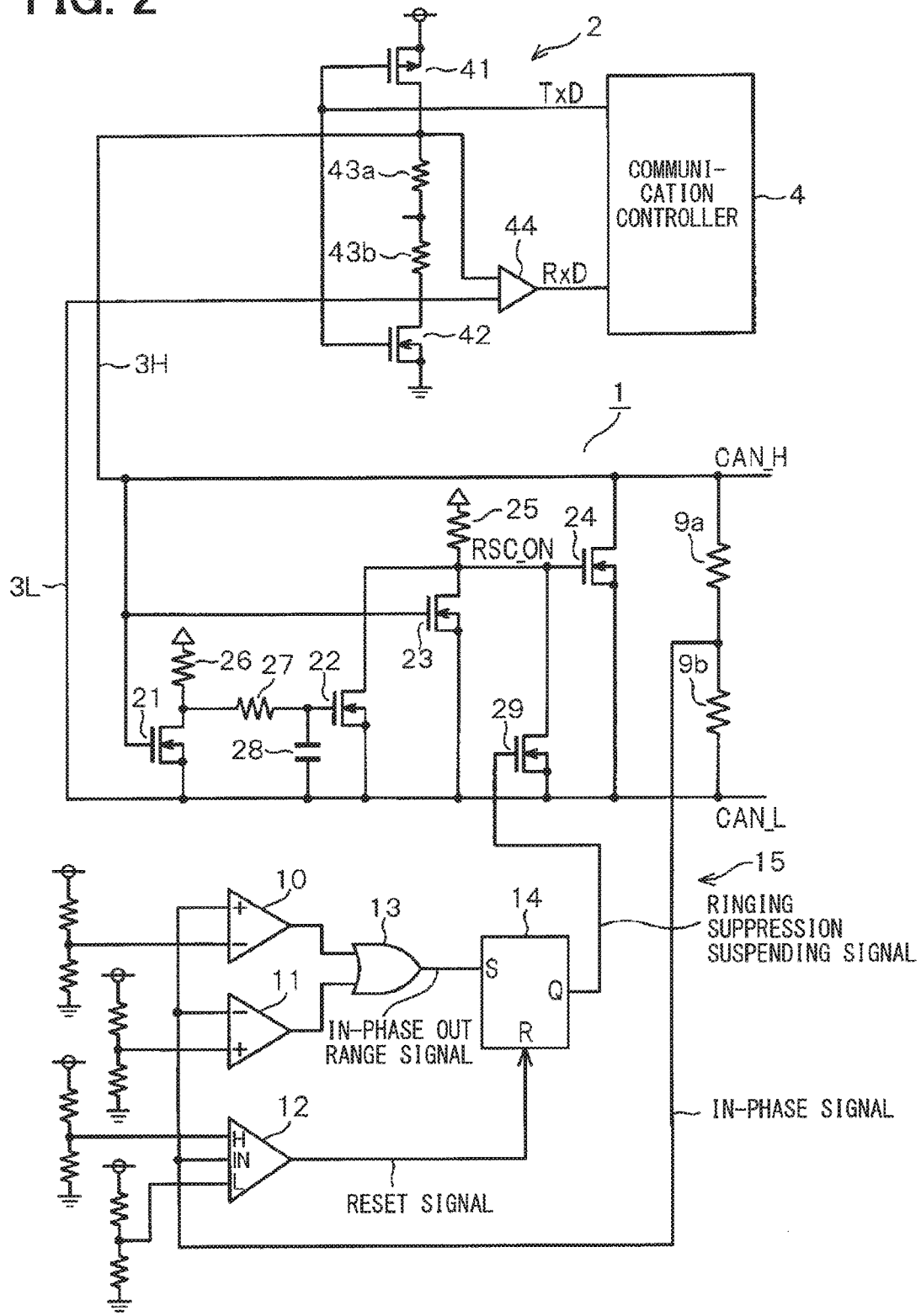
FIG. 2 is a diagram showing the ringing suppression circuit in more detail.

In FIG. 2 showing a more specific configuration, sources of the four N-channel MOSFETs 21 to 24, which are potential reference side conduction terminals, are connected to the low potential signal line 3L. Gates of the FETs 21 and 23, which are control terminals, are connected to the high potential signal line 3H.

The FET 24 is an inter-line switching element. Drain of the FET 24, which is a non-reference side conduction terminal, is connected to the high potential signal line 3H. The drains of the FETs 22 and 23 are connected to the gate of the FET 24, and pulled up to the high level, that is, the power supply level Vcc via a resistor element 25. The drain of the FET 21 is pulled up to the high level via a resistor element 26 and is connected to the gate of the FET 22 via a resistor element 27. The gate of the FET 22 is connected to the low potential signal line 3L via a capacitor 28. An N-channel MOSFET 29 is connected between the gate of the FET 24 and the low potential signal line 3L. The gate of the FET 29 is connected to the output terminal Q of the RS flip-flop 14. In the above configuration, the FET 24 corresponds to the series circuit of the suppression element 7 and the switch circuit 8 shown in FIG. 1. That is, an ON resistance of the FET 24 corresponds to the suppression element 7. Further, the FET 21 corresponds to the distortion suppression start detecting portion 5, and the other configuration corresponds to the suppression period control portion 6.

The transmission and reception circuit 2 includes a P-channel MOSFET 41 connected between the power supply and the signal line 3H, and an N-channel MOSFET 42 connected between the signal line 3L and the ground. Between the signal lines 3H and 3L, a series circuit including resistor elements 43a and 43b is connected. The gates of the FETs 41 and 42 are commonly connected to the output terminal of the communication controller 4, and receive transmission data TxD from the communication controller 4. The signal lines 3H and 3L are connected to input terminals of a receiver 44 and the receiver 44 outputs the reception data RxD to the communication controller 4.

Figure 3:
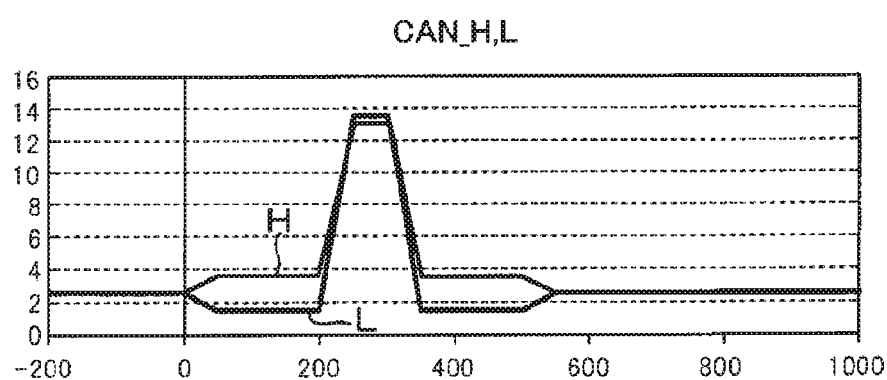
FIG. 3 is a diagram showing waveforms of a high potential signal line and a low potential signal line when noise is superimposed.
Figure 4:
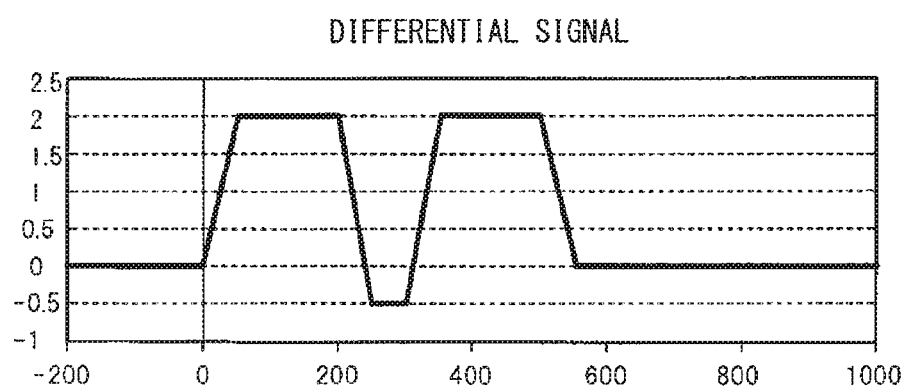
FIG. 4 is a diagram showing a waveform of a differential signal.
Figure 5:
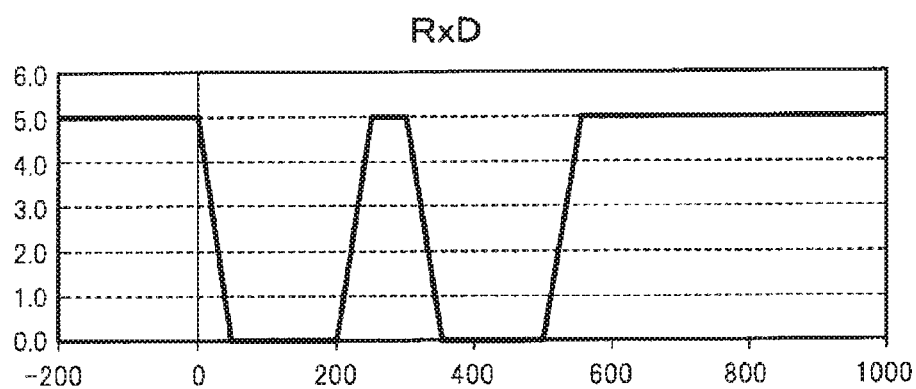
FIG. 5 is a diagram showing a waveform of a received signal RxD.
Figure 12:
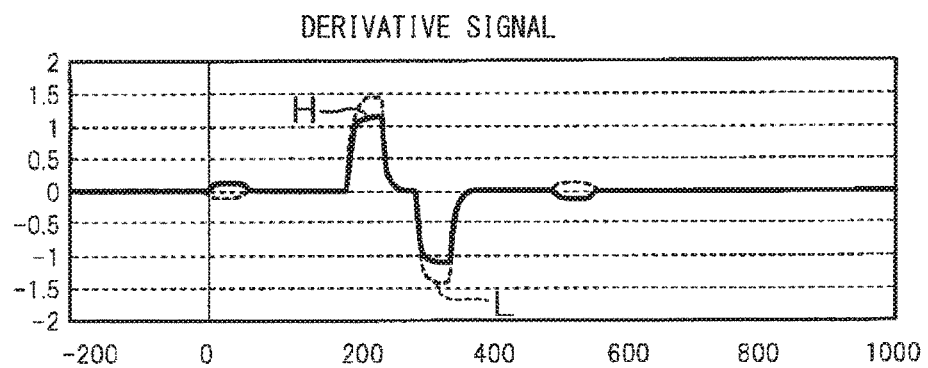
FIG. 12 is a diagram showing a waveform of a derivative signal when noise is superimposed.

Next, operation of the present embodiment will be described. As shown in FIG. 3, when noise similar to that shown in FIG. 12 is superimposed during a period in which a high level differential signal, that is, recessive in the CAN is transmitted in the transmission line 3, the differential signal input to the transmission and reception circuit 2 indicates low level during the superimposed period as shown in FIG. 4. The reception signal RxD output from the transmission and reception circuit 2 corresponds to an inverted signal of the differential signal as shown in FIG. 5.

Figure 6:
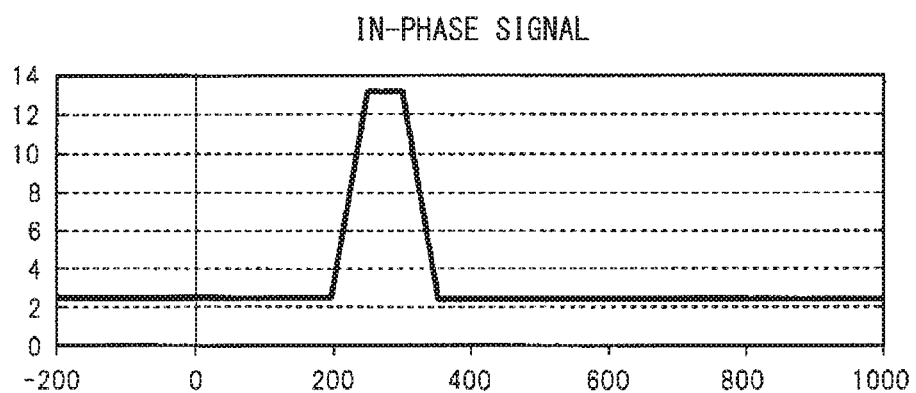
FIG. 6 is a diagram showing a waveform of an in-phase signal.
Figure 7:
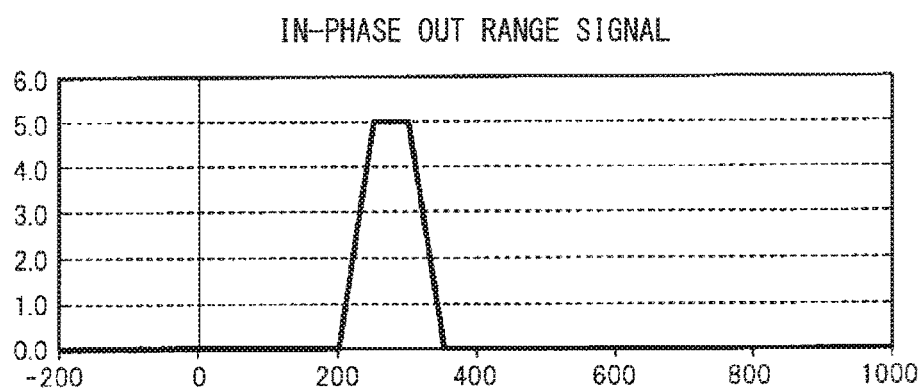
FIG. 7 is a diagram showing a waveform of an in-phase out range signal.

At this time, the in-phase signal input to the comparators 10 to 12 has a level corresponding to the noise level as shown in FIG. 6, and the output signal of the comparator 10 indicates the high level. As a result, as shown in FIG. 7, the high level in-phase out range signal is output. In waveforms after the noise in the signal changes disappears, the operation of the suppression operation prohibiting portion 15, which will be described later, is reflected.

Figure 9:
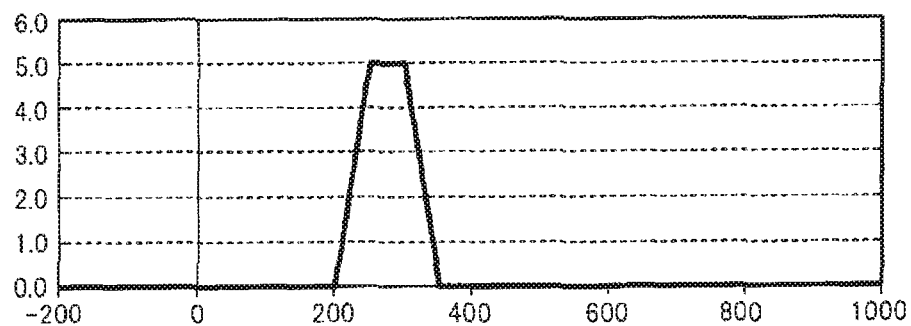
FIG. 9 is a diagram showing a waveform of a ringing suppression suspending signal.

The RS flip-flop 14 is set by the in-phase out range signal, and a ringing suppression suspending signal is output as shown in FIG. 9. In this case, the FET 29 is turned on to forcibly set the gate of the FET 24 to a low level. As a result, the FET 24 is maintained in the OFF state and the ringing suppression operation is prohibited. The ringing suppression suspending signal corresponds to a suppression operation prohibiting signal.

Figure 8:
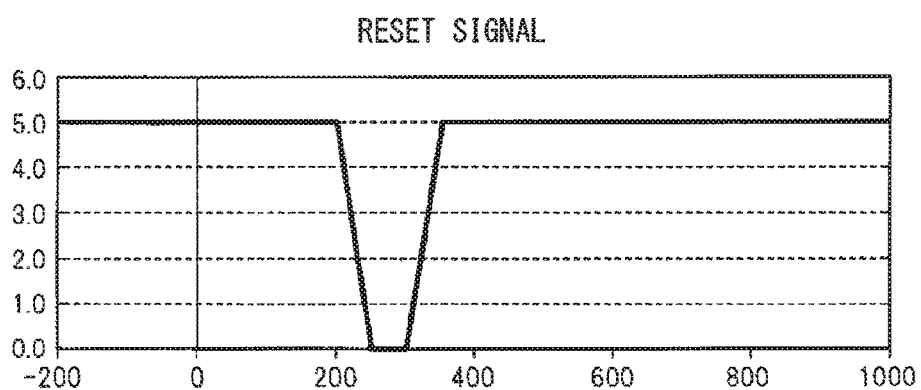
FIG. 8 is a diagram showing a waveform of a reset signal.

The reset signal supplied from the comparator 12 to the RS flip-flop 14 becomes low level corresponding to the noise superimposing period as shown in FIG. 8, and changes to high level as the noise disappears. Since the RS flip-flop 14 is reset at the rising edge of the reset signal accompanying the level change, the FET 29 is turned off and the prohibition state of the ringing suppression operation is released.

Figure 10:
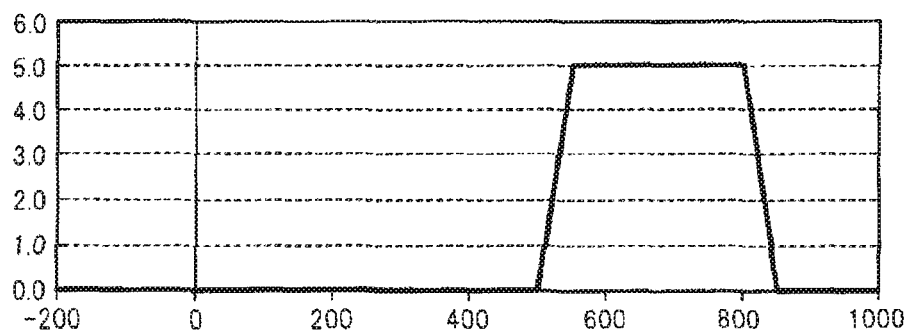
FIG. 10 is a diagram showing a waveform of a RSC_ON signal.

Then, with the change of the arriving differential signal to the low level, i.e., the recessive in the CAN, the ON signal RSC_ON is output to the gate of the FET 24 as shown in FIG. 10. As a result, the FET 24 is turned on and the ringing suppression operation is performed. As a result of prohibition of the ringing suppression operation and release of the ringing suppression operation, the waveforms of the differential signal, the reception signal RxD and the in-phase signal corresponding to the period are as shown in FIG. 3.

According to the present embodiment described above, the suppression operation prohibiting portion 15 prohibits the suppression period control portion 6 from performing the ringing suppression operation in response to detecting the in-phase signal, i.e., noise generated in the transmission line 3. A noise superimposed on the transmission line 3 appears as an in-phase signal. The suppression operation prohibiting portion 15 detects the generation of the in-phase signal as the noise and prohibits the ringing suppression operation. As a result, improper operation caused by the superimposed noise is avoided.

Specifically, the RS flip-flop 14 of the suppression operation prohibiting portion 15 outputs the ringing suppression suspending signal to the suppression period control portion 6 when the comparators 10 and 11 determines that the level of the in-phase signal is greater than the upper threshold or less than the lower threshold. After outputting the ringing suppression suspending signal, the RS flip-flop 14 suspends outputting the ringing suppression suspending signal when the comparator 12 determines that the level of the in-phase signal is within the certain range. Accordingly, the ringing suppression operation is prohibited during a period in which the in-phase signal greater than the certain level is generated in the transmission line 3.

(Second Embodiment)

Figure 11:
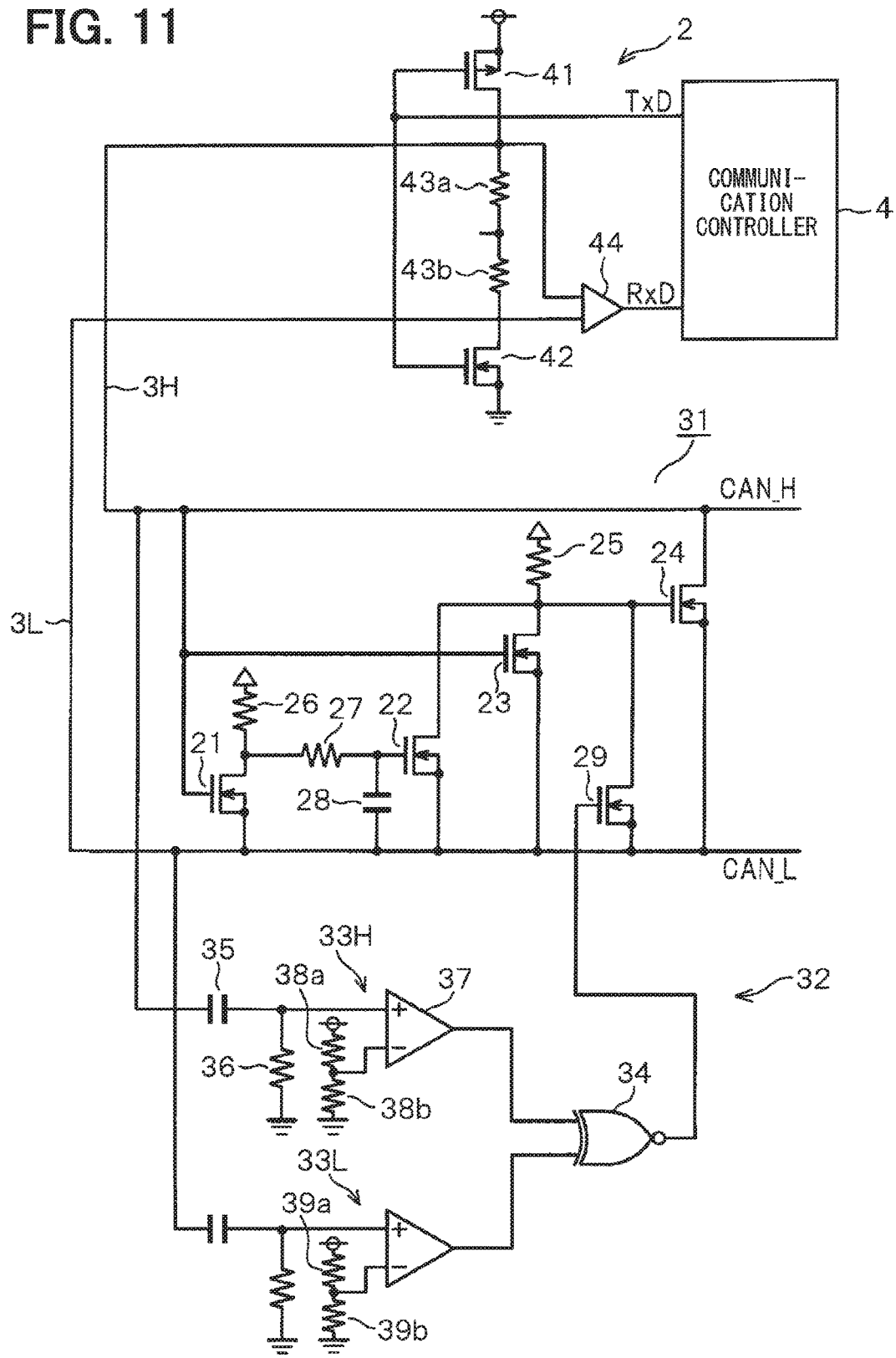
FIG. 11 is a diagram showing a configuration of a ringing suppression circuit according to a second embodiment.

Hereinafter, the same parts as those in the first embodiment will be designated by the same reference numerals and descriptions thereof will be omitted. The following description will focus on different parts. As shown in FIG. 11, a ringing suppression circuit 31 of a second embodiment is provided with a suppression operation prohibiting portion 32 in place of the suppression operation prohibiting portion 15. The suppression operation prohibiting portion 32 includes derivative circuits 33H and 33L and an EXNOR gate 34. The derivative circuit 33 includes a series circuit of a capacitor 35 and a resistor element 36 and an operational amplifier 37.

One end of the capacitor 35 providing the derivative circuit 33H is connected to the high potential signal line 3H and one end of the capacitor 35 providing the derivative circuit 33L is connected to the low potential signal line 3L. A common connection point of the capacitor 35 and the resistor element 36 is connected to a non-inverting input terminal of the operational amplifier 37. An inverting input terminal of the operational amplifier 37 connected to the derivative circuit 33H is connected to a common connection point of a series circuit of resistors 38a and 38b connected between the power source and the ground. An inverting input terminal of the operational amplifier 37 connected to the derivative circuit 33L is connected to a similar common connection point of a series circuit of resistors 39a and 39b.

The resistors 38a, 38b and the resistors 39a, 39b provides different thresholds for the derivative circuits 33H and 33L. For example, the threshold of the derivative circuit 33H is set to 0.1 V, and the threshold of the derivative circuit 33H is set to 0V. Thus, when the levels of the signal lines 3H and 3L do not change and the respective derivative values are zero, the output level values of the derivative circuits 33H and 33L are different with each other. The output terminal of the operational amplifier 37 is connected to the input terminal of the EXNOR gate 34, and the output terminal of the EXNOR gate 34 is connected to the gate of the FET 29. The derivative circuits 33H and 33L correspond to a high potential polarity determining portion and a low potential polarity determining portion. The EXNOR gate 34 corresponds to a signal outputting portion.

Next, operation of the second embodiment will be described. Since the noise appears as an in-phase signal on the transmission line 3, the polarity of the derivative signal detected for the signal lines 3H, 3L according to the signal change consists with each other. Therefore, by detecting the consistency of both polarities by the EXNOR gate 34 and outputting the ringing suppression suspending signal to the gate of the FET 29, the ringing suppression operation is inhibited as noise occurs, similarly to the first embodiment.

Figure 13:
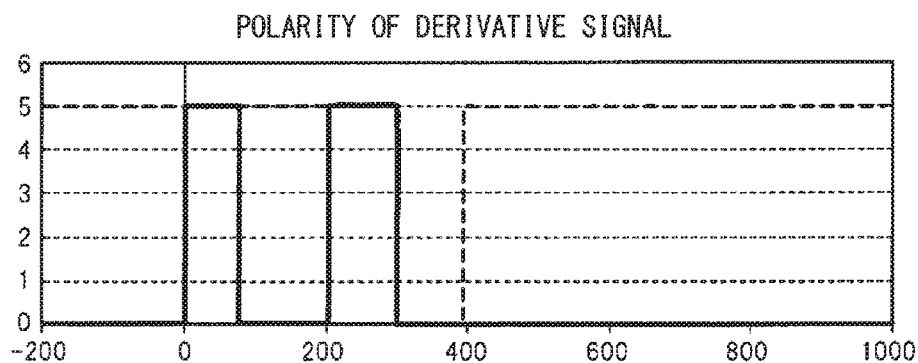
FIG. 13 is a diagram showing a waveform of a derivative signal polarity.
Figure 14:
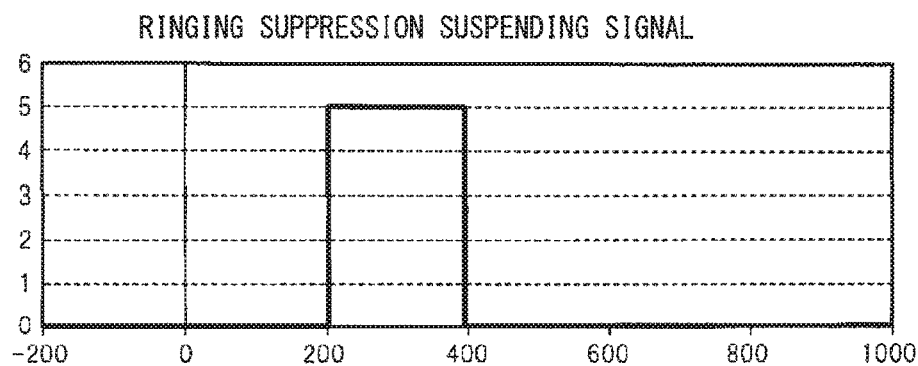
FIG. 14 is a diagram showing a waveform of a ringing suppression suspending signal.

FIGS. 12 to 14 are waveforms of the derivative signal, the polarity thereof, and the ringing suppression suspending signal in the case where the same noise as in FIGS. 3 and 4 of the first embodiment is superimposed. The ringing suppression suspending signal is output during a period in which the values of the derivative signals of the signal lines 3H and 3L are equal to or greater than a predetermined value and the signal polarities consist with each other.

According to the second embodiment described above, the EXNOR gate 34 of the suppression operation prohibiting portion 32 outputs the ringing suppression suspending signal to the suppression period control portion 6 during the period in which the level change polarities of the signal lines 3H and 3L determined by the derivative circuits 33H and 33L consist with other. As such, similarly to the first embodiment, the ringing suppression operation is prohibited.

(Third Embodiment)

Figure 15:
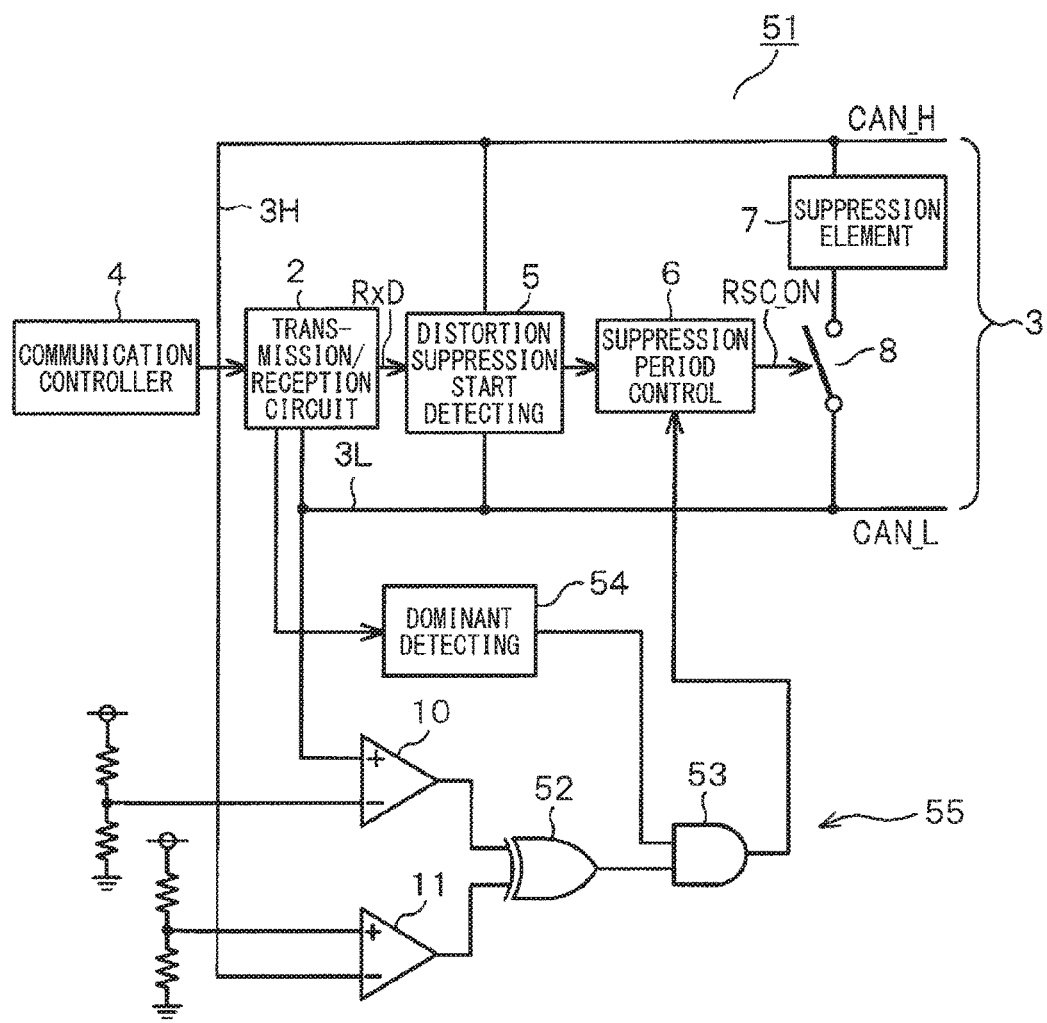
FIG. 15 is a functional block diagram showing a configuration of a ringing suppression circuit according to a third embodiment.
Figure 16:
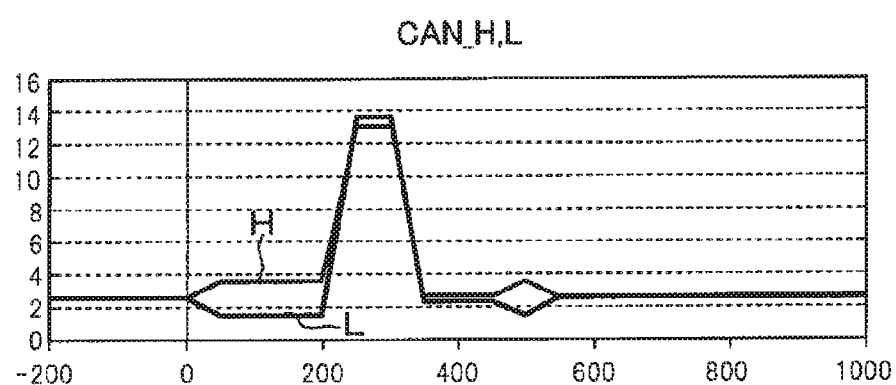
FIG. 16 is a diagram showing conventional waveforms of a high potential signal line and a low potential signal line when noise is superimposed.
Figure 17:
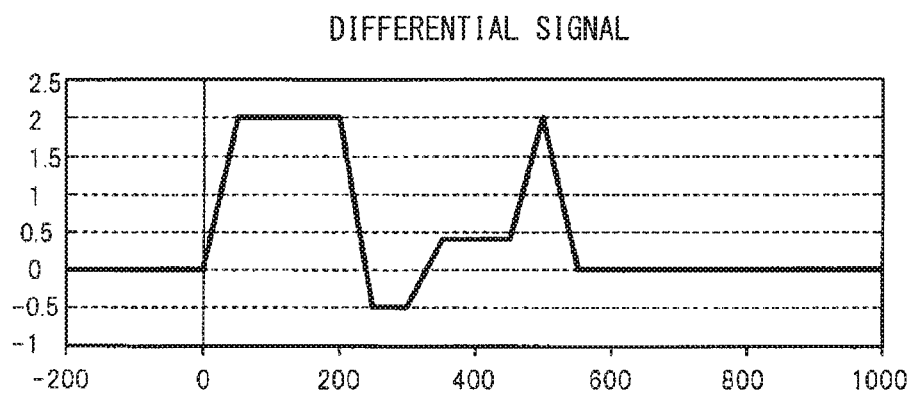
FIG. 17 is a diagram showing a waveform of a differential signal.
Figure 18:
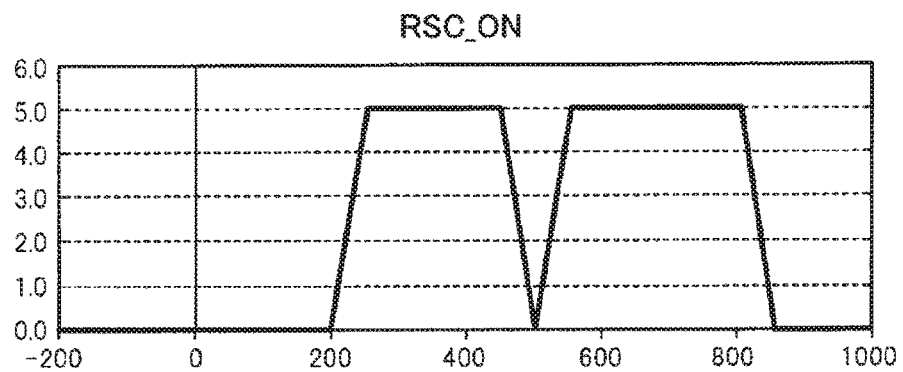
FIG. 18 is a diagram showing a waveform of a RSC_ON signal.
Figure 19:
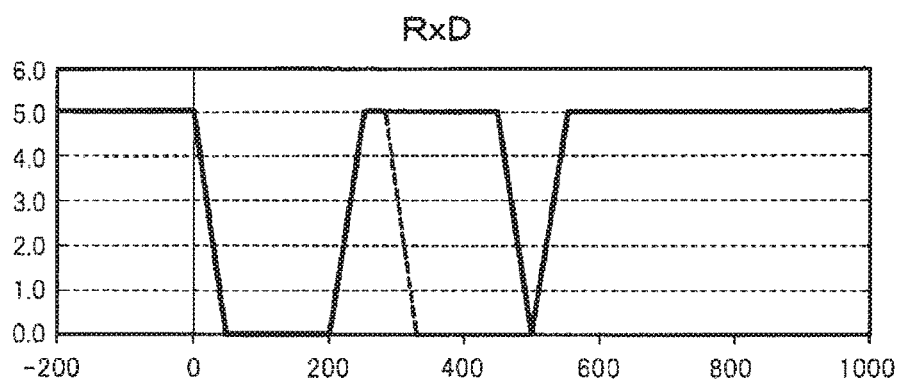
FIG. 19 is a diagram showing a waveform of a received signal RxD.

As shown in FIG. 15, in a ringing suppression circuit 51 of a third embodiment, the comparator 12 is removed from the ringing suppression circuit 1 of the first embodiment, an EXOR gate 52 is arranged instead of the OR gate 13, and an AND gate 53 is arranged instead of the RS flip-flop 14, and a dominant detecting portion 54 is added. A non-inverting input terminal of a comparator 10 is connected to the signal line 3L, and an inverting input terminal of a comparator 11 is connected to the signal line 3H. These correspond to a suppression operation prohibiting portion 55.

An output terminal of the EXOR gate 52 is connected to one of input terminals of the AND gate 53. Upon detecting that a dominant signal is generated in the transmission line 3 via the transmission and reception circuit 2, the dominant detecting portion 54 outputs a high level signal to the other input terminal of the AND gate 53. The AND gate 53 corresponds to a signal outputting portion, and outputs a suppression operation suspending signal to the suppression period control portion 6.

Next, operation of the third embodiment will be described. In the third embodiment, there is a possibility that a large level of noise is induced on either the high level side or the low level side depending on the state of artwork, twisted pair wire, connector pin arrangement, or the like on the circuit board. The comparator 11 detects that the voltage level of the signal line 3H is lower than the threshold, and the comparator 10 detects that the voltage level of the signal line 3L is greater than the threshold. As such, each of the comparator 11 and the comparator 10 detects the high level signal.

Then, the AND gate 53 outputs a suppression operation suspending signal to the suppression period control portion 6 during the period in which the comparator 10 or 11 outputs the high level signal and the dominant detecting portion 54 detects the generation of the dominant signal. As a result, a glitch, which is an edge generated based on noise, is detected and the ringing suppression operation is prohibited.

According to the third embodiment described above, the ringing suppression operation is prohibited during the period in which the state where the voltage level of the signal line 3H is lower than the threshold is detected or the state where the voltage level of the signal line 3L is greater than the threshold is detected. As a result, improper operation is avoided even when a large noise is applied to one of the signal lines 3H and 3L.

(Other Embodiments)

Specific numerical values of each voltage may be appropriately changed according to individual design.

The ringing suppression suspending signal may be received by the transmission and reception circuit 2 and used for determining the level of the reception signal RxD.

The communication protocol is not limited to CAN, and any communication protocol may be applied as long as using a differential signal.

Although the present disclosure is described based on the above embodiments, the present disclosure is not limited to the embodiments and the structures. Various changes and modification may be made in the present disclosure. Furthermore, various combination and formation, and other combination and formation including one, more than one or less than one element may be made in the present disclosure.

The invention claimed is:

1. A ringing suppression circuit connected to a transmission line to suppress ringing caused by the transmission line transmitting a differential signal using a pair of signal lines, the differential signal varying between a high level and a low level, the pair of signal lines including a high potential signal line and a low potential signal line, the ringing suppression circuit comprising:
    an inter-line switching element that is connected between the pair of signal lines;
    a control portion that performs a ringing suppression operation in response to detecting a level change in the differential signal, wherein the ringing suppression operation turns on the inter-line switching element to decrease an impedance between the pair of signal lines; and
    a suppression operation prohibiting portion that prohibits the control portion from performing the ringing suppression operation in response to detecting a signal caused by a signal on the transmission line.

2. The ringing suppression circuit according to claim 1, wherein
    the signal caused by the signal on the transmission line is an in-phase signal.

3. The ringing suppression circuit according to claim 2, wherein
    the suppression operation prohibiting portion includes:
        an upper limit determining portion that determines whether a level of the in-phase signal is greater than an upper threshold;
        a lower limit determining portion that determines whether the level of the in-phase signal is less than a lower threshold;
        a normal range determining portion that determines whether the level of the in-phase signal is within a certain range; and
        a signal outputting portion that outputs a suppression operation prohibiting signal to the control portion when the level of the in-phase signal is greater than the upper threshold or less than the lower threshold, and after outputting the suppression operation prohibiting signal, suspends outputting the suppression operation prohibiting signal when the normal range determining portion determines that the level of the in-phase signal is within the certain range.

4. The ringing suppression circuit according to claim 1, wherein
the suppression operation prohibiting portion includes:
   a high potential polarity determining portion that determines a polarity of a level change in the high potential signal line;
   a low potential polarity determining portion that determines a polarity of a level change in the low potential signal line; and
   a signal outputting portion that outputs a suppression operation prohibiting signal to the control portion during a period in which absolute values of the level change in the high potential signal line and the level change in the low potential signal line are greater than a predetermined value, and the polarity of the level change in the high potential signal line and the polarity of the level change in the low potential signal line consist with each other.

5. The ringing suppression circuit according to claim 1, wherein
the suppression operation prohibiting portion includes:
   a high potential voltage level determining portion that determines whether a voltage level of the high potential signal line is less than a threshold;
   a low potential voltage level determining portion that determines whether a voltage level of the low potential signal line is greater than a threshold; and
   a signal outputting portion that outputs a suppression operation prohibiting signal to the control portion during a period in which the voltage level of the high potential signal line is less than the threshold or the voltage level of the low potential signal line is greater than the threshold.

6. A ringing suppression method comprising:
prohibiting a ringing suppression operation, while performing the ringing suppression operation in response to detecting a level change in a differential signal transmitted by a transmission line, in response to detecting a signal caused by a signal on the transmission line, wherein the transmission line transmits the differential signal using a pair of signal lines, the pair of signal lines includes a high potential signal line and a low potential signal line, the differential signal varies between a high level and a low level, and the ringing suppression operation decreases an impedance between the pair of signal lines.

7. The ringing suppression method according to claim 6, wherein
the signal caused by the signal on the transmission line is an in-phase signal.

8. The ringing suppression method according to claim 7, wherein
the ringing suppression operation is prohibited when a level of the in-phase signal is greater than an upper threshold or less than a lower threshold, and
after the ringing suppression operation is prohibited, the ringing suppression operation is released from being prohibited when the level of the in-phase signal is determined to be within a certain range.

9. The ringing suppression method according to claim 6, wherein
the ringing suppression operation is prohibited during a period in which absolute values of a level change in the high potential signal line and a level change in the low potential signal line are greater than a predetermined value, and a polarity of the level change in the high potential signal line and a polarity of the level change in the low potential signal line consist with each other.

10. The ringing suppression method according to claim 6, wherein
the ringing suppression operation is prohibited during a period in which a voltage level of the high potential signal line is less than a threshold and a voltage level of the low potential signal line is greater than a threshold.

11. A ringing suppression circuit, comprising:
a switch circuit coupled between a pair of signal lines forming a transmission line, the pair of signal lines including a high potential signal line and a low potential signal line configured to transmit a differential signal that varies between a high level and a low level;
a voltage monitor circuit coupled to the transmission line, the voltage monitor circuit being configured to detect a noise signal generated in the transmission line, and
a control circuit coupled to the switch circuit and the voltage monitor circuit, the control circuit being configured to:
   turn on the switch circuit in response to detecting a level change in the differential signal to decrease an impedance between the pair of signal lines; and
   turn off the switch circuit in response to the voltage monitor circuit detecting the noise signal.

* * * * *